US012757596B2

(12) United States Patent
Saitoh et al.

(10) Patent No.: US 12,757,596 B2
(45) Date of Patent: Oct. 6, 2026

(54) DISPLAY DEVICE

(71) Applicant: Sharp Display Technology Corporation, Kameyama City (JP)

(72) Inventors: Takao Saitoh, Kameyama City (JP); Yohsuke Kanzaki, Kameyama City (JP); Masaki Yamanaka, Kameyama City (JP); Masahiko Miwa, Kameyama City (JP); Yi Sun, Kameyama City (JP); Masaki Fujiwara, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 357 days.

(21) Appl. No.: 18/571,539

(22) PCT Filed: Jul. 27, 2021

(86) PCT No.: PCT/JP2021/027722
§ 371 (c)(1),
(2) Date: Dec. 18, 2023

(87) PCT Pub. No.: WO2023/007582
PCT Pub. Date: Feb. 2, 2023

(65) Prior Publication Data
US 2024/0357887 A1 Oct. 24, 2024

(51) Int. Cl.
*H10K 59/131* (2023.01)
*H10K 59/80* (2023.01)
*H10K 102/00* (2023.01)

(52) U.S. Cl.
CPC ......... *H10K 59/131* (2023.02); *H10K 59/873* (2023.02); *H10K 2102/311* (2023.02)

(58) Field of Classification Search
CPC ............... H10K 59/131; H10K 59/873; H10K 2102/311; H10K 59/124; H10K 77/111; G09F 9/30
See application file for complete search history.

(56) References Cited

U.S. PATENT DOCUMENTS 10,754,387 B2 * 8/2020 Saitoh .................. G06F 1/1652
11,889,728 B2 * 1/2024 Okabe .................... H05B 33/02
(Continued)

FOREIGN PATENT DOCUMENTS

JP 2018-054675 A 4/2018
WO 2019/163030 A1 8/2019
WO 2019/186812 A1 10/2019

*Primary Examiner* — Victor A Mandala
(74) *Attorney, Agent, or Firm* — ScienBiziP, P.C.

(57) ABSTRACT

A display device includes a resin substrate, a thin film transistor layer, and a light-emitting element layer. A frame region is provided surrounding a display region. A terminal portion is provided at an end portion of the frame region. A bending portion is provided between the display region and the terminal portion. A slit is provided at the bending portion in an inorganic insulating film. A resin filling film is provided at the bending portion. A plurality of lead wiring lines are provided on the resin filling film. Protrusions and recesses, each extending in a direction intersecting an extending direction of the bending portion, are alternately disposed in the extending direction of the bending portion on a surface of the resin filling film. At least one of the plurality of lead wiring lines is provided on a protrusion of the protrusions.

16 Claims, 14 Drawing Sheets

(56) References Cited

U.S. PATENT DOCUMENTS

| | | | | |
|---|---|---|---|---|
| 2016/0155788 | A1* | 6/2016 | Kwon | H10K 59/124 257/40 |
| 2018/0088390 | A1 | 3/2018 | Ohara | |
| 2018/0286938 | A1* | 10/2018 | Moon | H10D 86/411 |
| 2020/0006397 | A1* | 1/2020 | Park | H10D 86/443 |
| 2020/0150725 | A1* | 5/2020 | Saitoh | H10K 77/111 |
| 2020/0280015 | A1* | 9/2020 | Odaka | G06V 40/1318 |
| 2021/0050395 | A1* | 2/2021 | Okabe | H10K 59/122 |
| 2021/0057500 | A1 | 2/2021 | Saitoh et al. | |
| 2021/0057511 | A1* | 2/2021 | Saitoh | H10K 59/131 |
| 2021/0098548 | A1* | 4/2021 | Ochi | H10K 59/878 |
| 2021/0210583 | A1* | 7/2021 | Okabe | G09F 9/30 |
| 2021/0351263 | A1* | 11/2021 | Okabe | H10K 59/8731 |
| 2021/0367207 | A1* | 11/2021 | Zhang | H10K 59/88 |
| 2025/0063920 | A1* | 2/2025 | Okabe | H10K 59/131 |

* cited by examiner

DISPLAY DEVICE

TECHNICAL FIELD

The disclosure relates to a display device.

BACKGROUND ART

In recent years, as a display device replacing a liquid crystal display device, a self-luminous organic electroluminescence (hereinafter also referred to as "EL") display device using an organic EL element is widely known. Among such organic EL display devices, a flexible organic EL display device in which an organic EL element or the like is formed on a resin substrate having flexibility is attracting attention. Here, in the organic EL display device, there is provided a frame region surrounding a rectangular display region for displaying an image, and reduction of the frame region is demanded. Additionally, with the flexible organic EL display device, for example, reducing the frame region by bending the frame region on the terminal portion side on which a plurality of terminals are arrayed has been proposed.

For example, PTL 1 discloses a display device in which an opening exposing an upper surface of a resin substrate is formed in an inorganic insulating film at a bending portion of the frame region, and a plurality of wiring lines extending parallel with each other in a direction intersecting an extending direction of the bending portion are provided on a surface of the inorganic insulating film and the upper surface of the resin substrate exposed from the opening.

CITATION LIST

Patent Literature

PTL 1: WO 2019/163030

SUMMARY

Technical Problem

Incidentally, in the flexible organic EL display device, inorganic insulating films, such as a base coat film, a gate insulating film, and an interlayer insulating film, are provided on a resin substrate. Thus, in order to suppress disconnection of the wiring lines disposed in the frame region, the inorganic insulating films on a bending portion of the frame region are removed to suppress breakage of the inorganic insulating films in the bending portion, as in PTL 1 described above. Here, in the bending portion of the frame region, a plurality of wiring lines are provided extending parallel with each other in a direction intersecting the extending direction of the bending portion. However, in a structure in which a metal film constituting the wiring lines is likely to remain between adjacent wiring lines, the plurality of wiring lines may be short-circuited.

The disclosure has been made in view of the above, and an object of the disclosure is to suppress short-circuiting between wiring lines in a bending portion of a frame region.

Solution to Problem

In order to achieve the object described above, a display device according to the disclosure includes a resin substrate, a thin film transistor layer provided on the resin substrate and including an inorganic insulating film, and a light-emitting element layer provided on the thin film transistor layer and arrayed with a plurality of light-emitting elements corresponding to a plurality of subpixels constituting a display region. A frame region is provided surrounding the display region. A terminal portion is provided at an end portion of the frame region. A bending portion is provided between the display region and the terminal portion, the bending portion extending in one direction. A slit is provided at the bending portion in the inorganic insulating film, the slit extending in an extending direction of the bending portion and exposing a surface of the resin substrate. A resin filling film is provided at the bending portion, the resin filling film filling the slit. A plurality of lead wiring lines are provided on the resin filling film, the plurality of lead wiring lines extending parallel with each other in a direction intersecting the extending direction of the bending portion. Protrusions and recesses, each extending in a direction intersecting the extending direction of the bending portion, are alternately disposed in the extending direction of the bending portion on a surface of the resin filling film. At least one of the plurality of lead wiring lines is provided on a protrusion of the protrusions.

Advantageous Effects of Disclosure

According to the disclosure, it is possible to suppress short-circuiting between wiring lines in a bending portion of a frame region.

DESCRIPTION OF EMBODIMENTS

Embodiments of a technique according to the disclosure will be described below in detail with reference to the drawings. Note that the technique according to the disclosure is not limited to the embodiments described below.

First Embodiment

Figure 1:
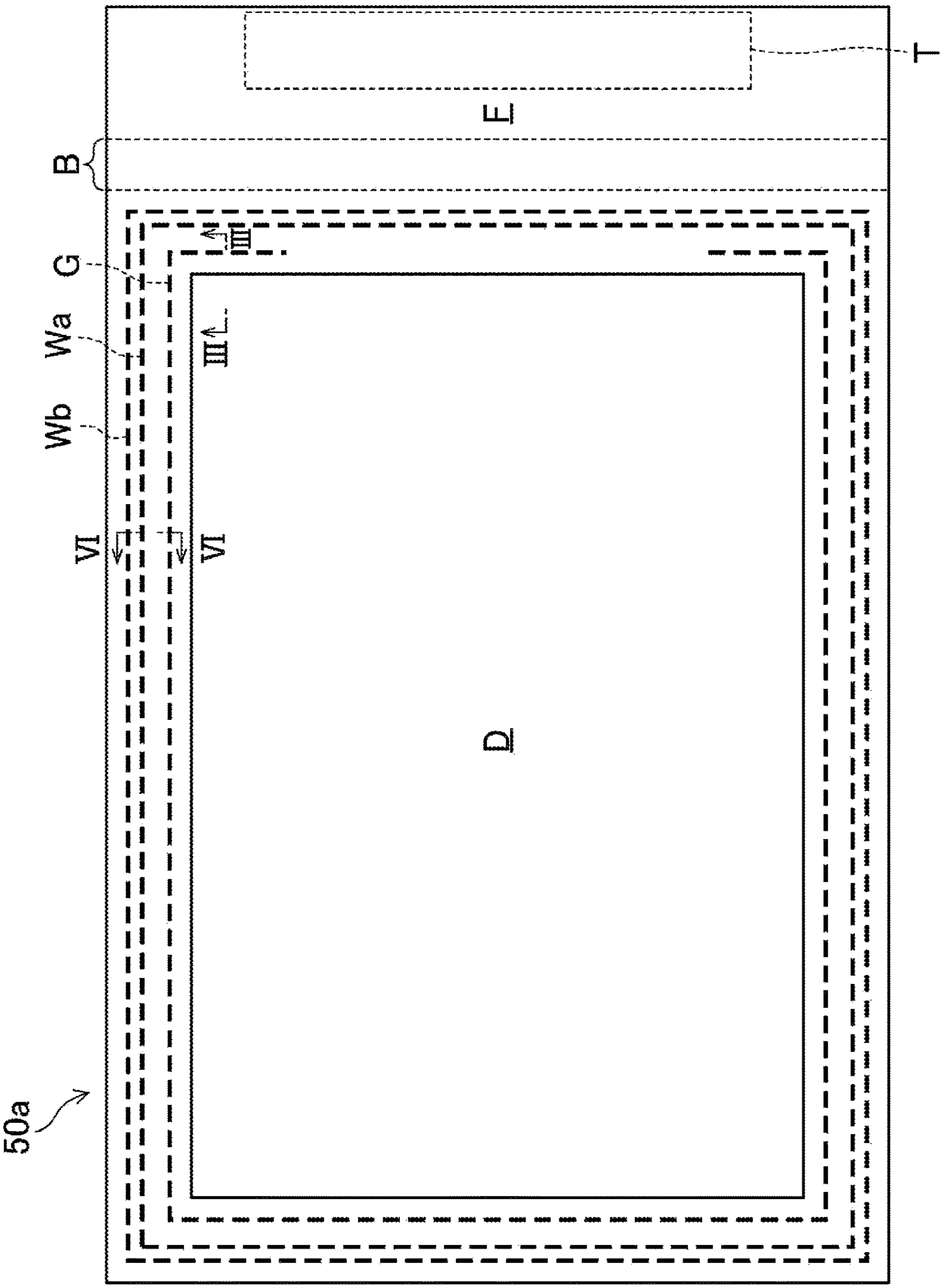
FIG. 1 is a plan view illustrating a schematic configuration of an organic EL display device according to a first embodiment of the disclosure.
Figure 2:
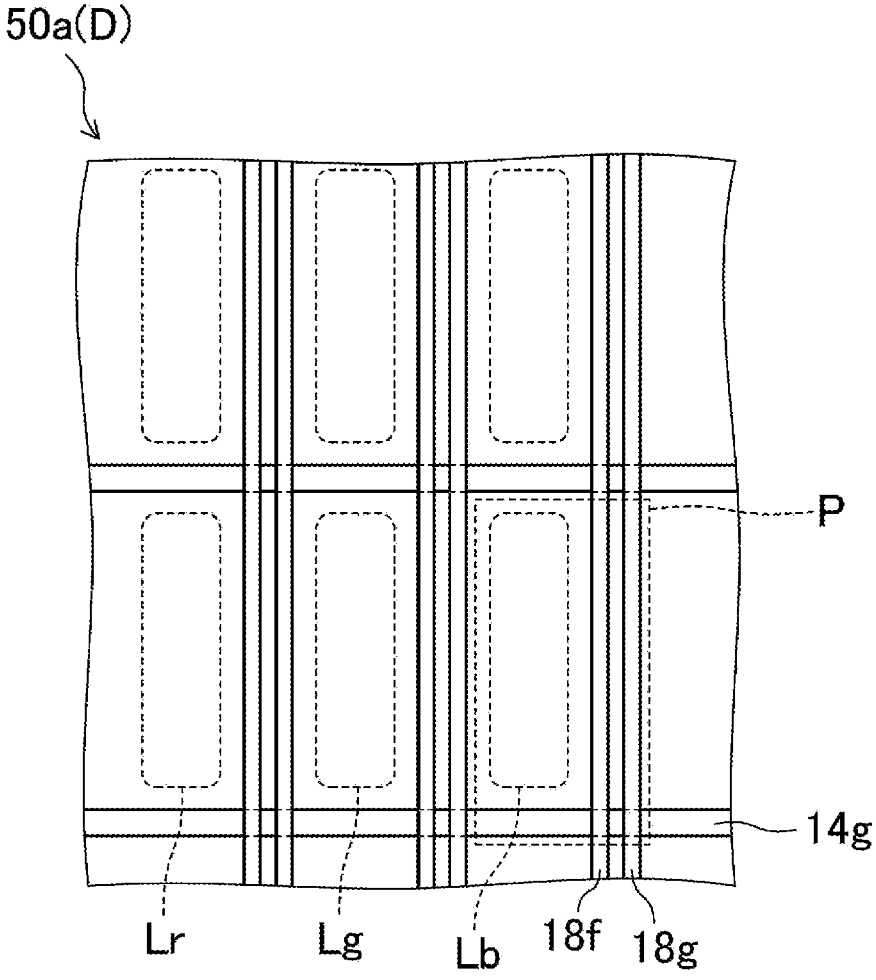
FIG. 2 is a plan view of a display region of the organic EL display device according to the first embodiment of the disclosure.
Figure 3:
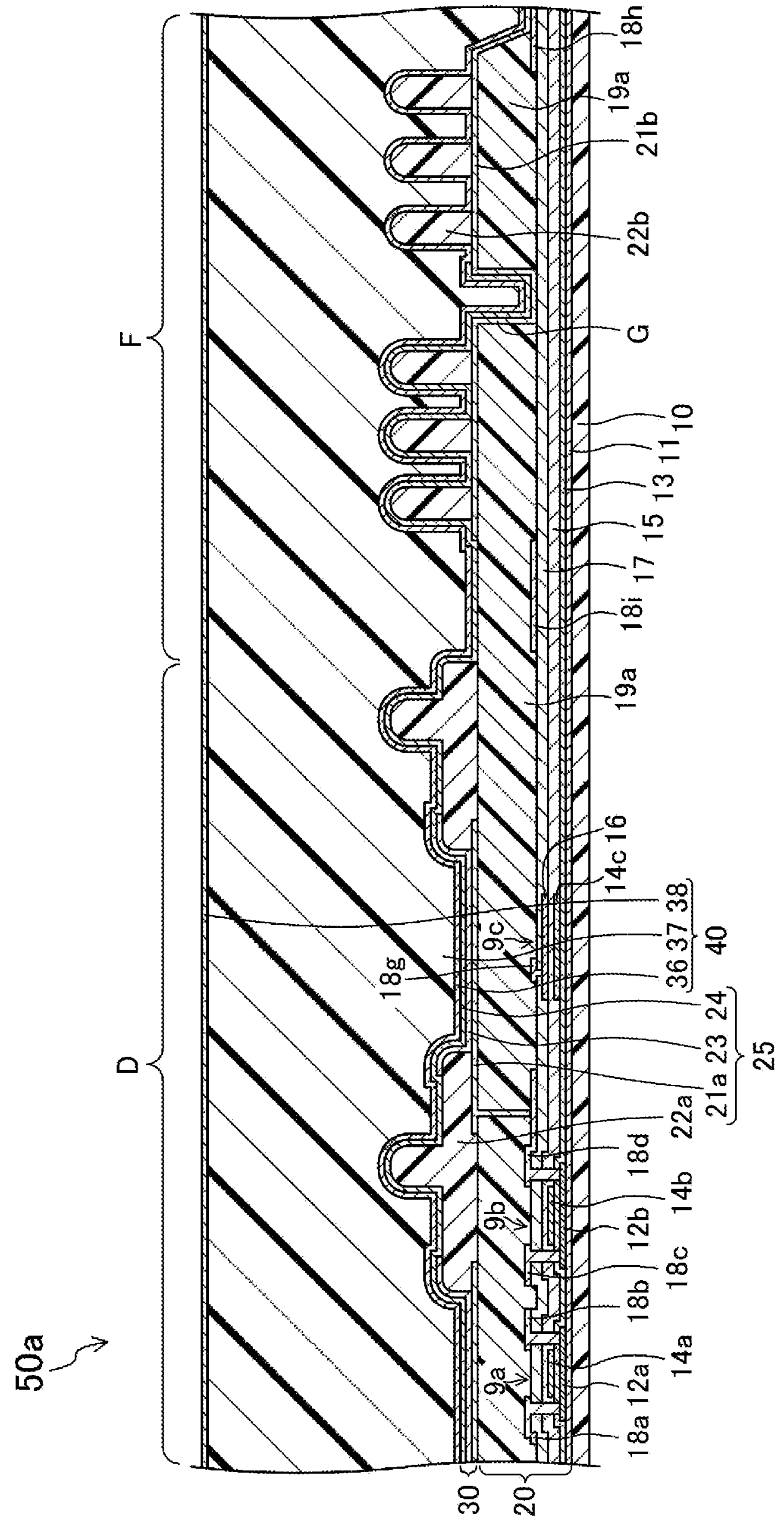
FIG. 3 is a cross-sectional view of the organic EL display device taken along a line III-III in FIG. 1.
Figure 4:
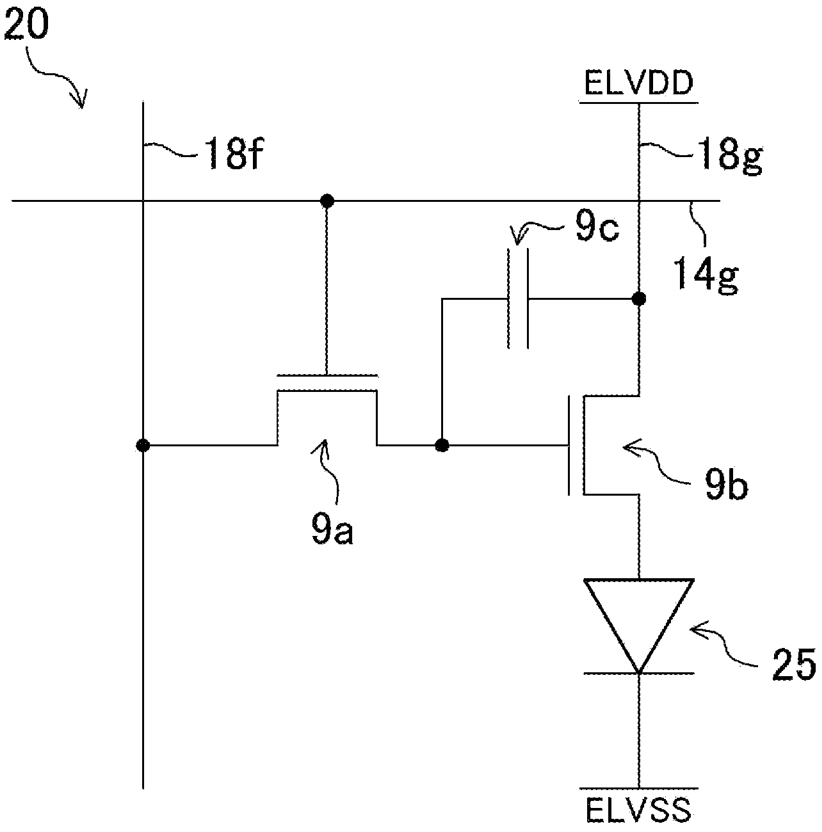
FIG. 4 is an equivalent circuit diagram of a thin film transistor layer constituting the organic EL display device according to the first embodiment of the disclosure.
Figure 5:
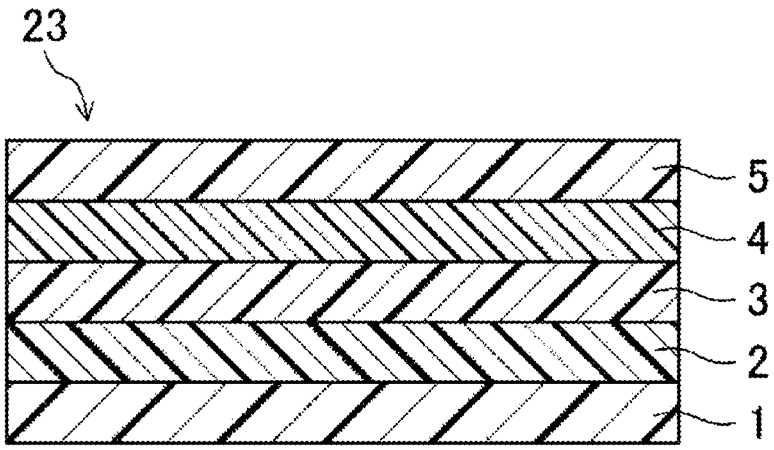
FIG. 5 is a cross-sectional view of an organic EL layer constituting the organic EL display device according to the first embodiment of the disclosure.
Figure 6:
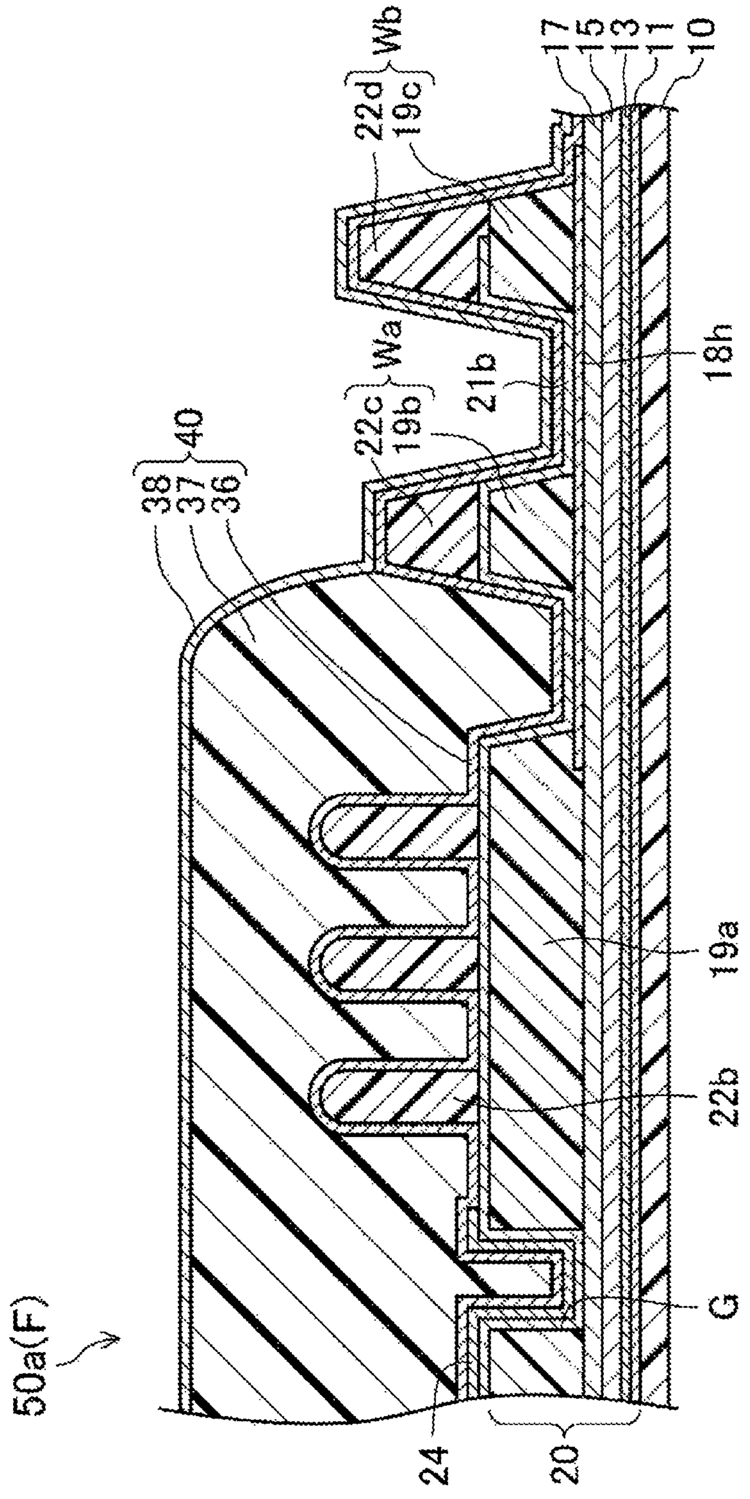
FIG. 6 is a cross-sectional view of a frame region of the organic EL display device taken along a line VI-VI in FIG. 1.
Figure 7:
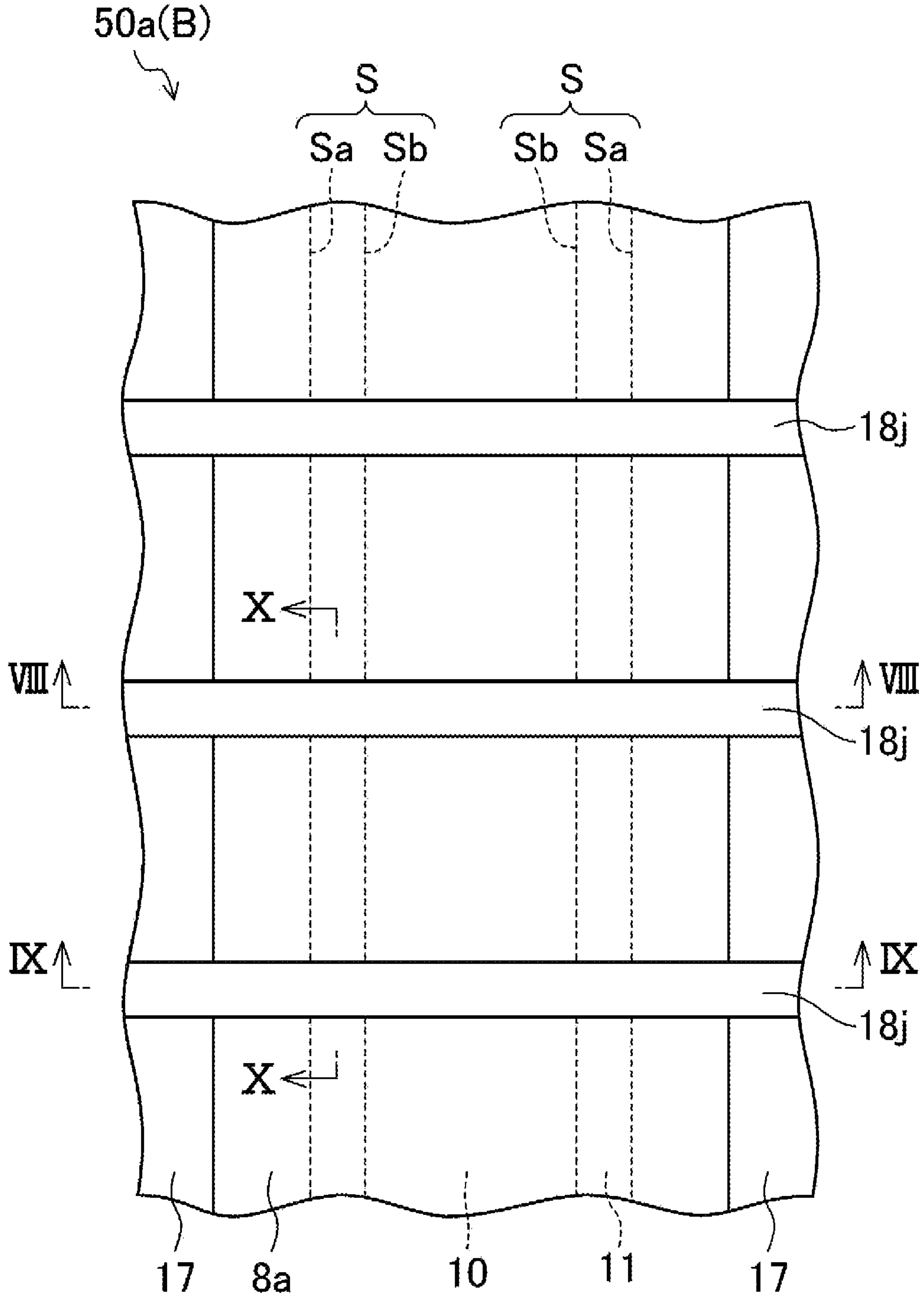
FIG. 7 is a plan view of a bending portion of the frame region of the organic EL display device according to the first embodiment of the disclosure.
Figure 8:
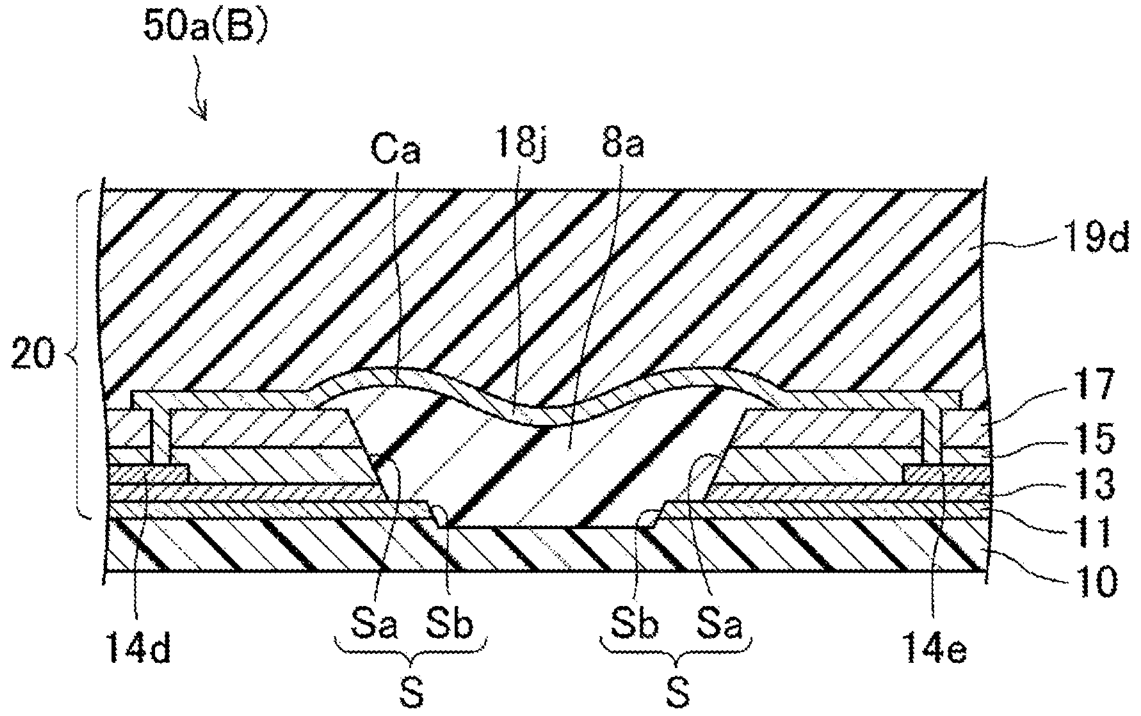
FIG. 8 is a cross-sectional view of the bending portion of the organic EL display device taken along a line VIII-VIII in FIG. 7.
Figure 9:
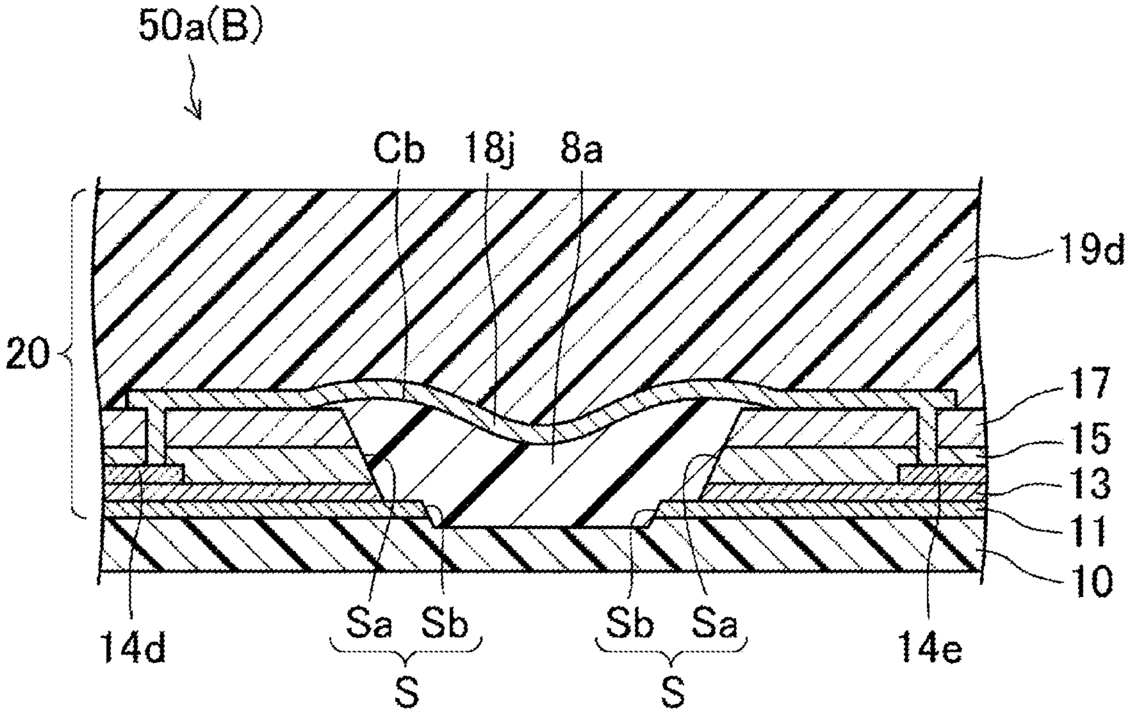
FIG. 9 is a cross-sectional view of the bending portion of the organic EL display device taken along a line IX-IX in FIG. 7.
Figure 10:
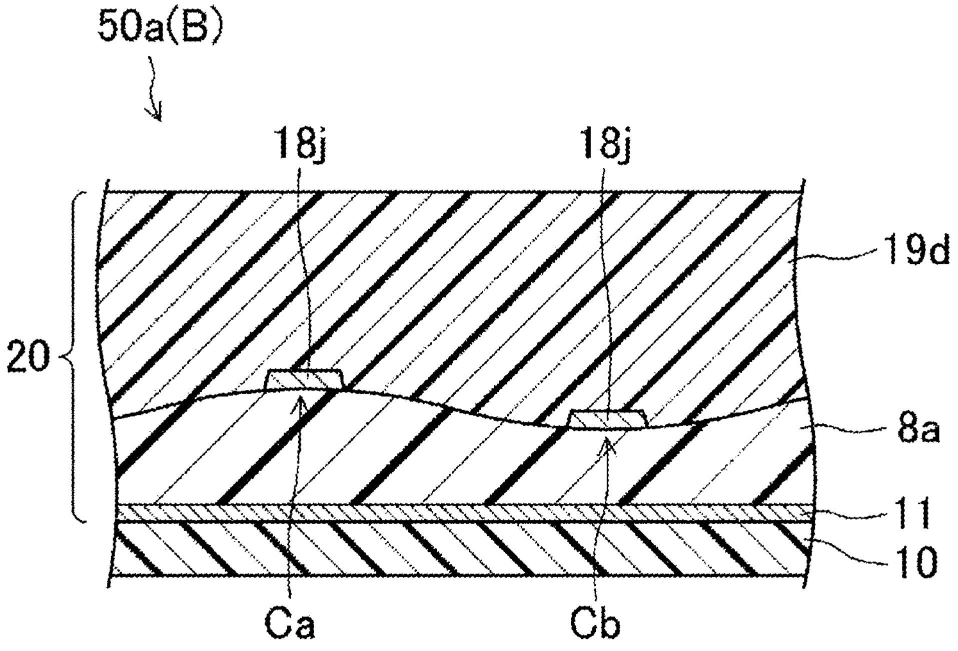
FIG. 10 is a cross-sectional view of the bending portion of the organic EL display device taken along line X-X in FIG. 7.
Figure 11:
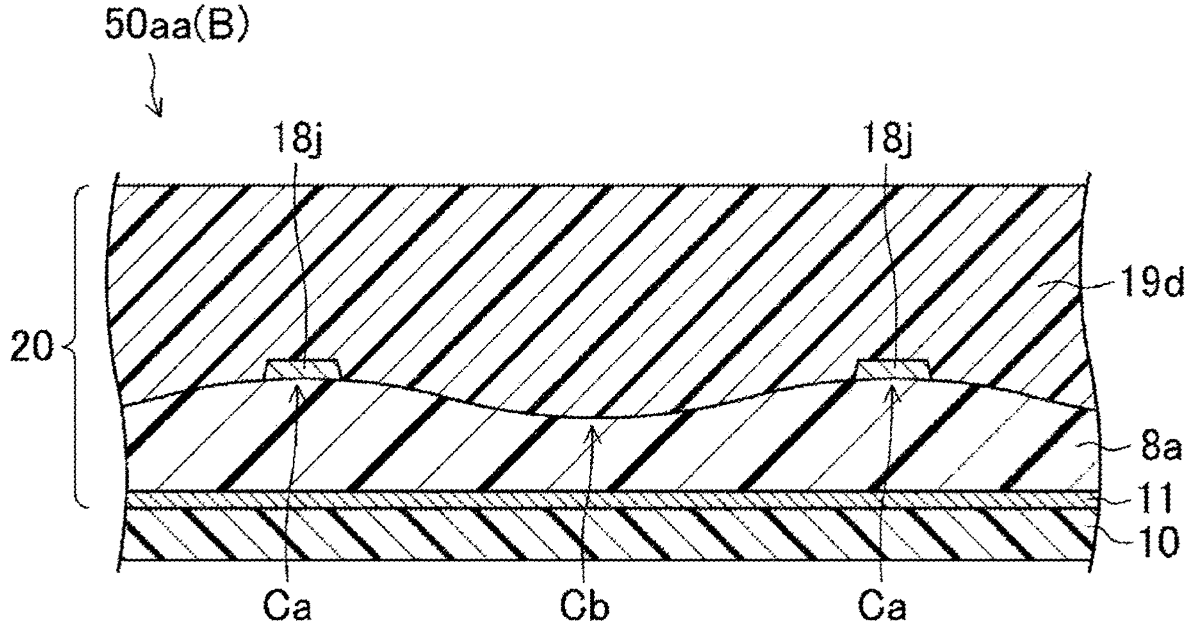
FIG. 11 is a cross-sectional view of a modified example of the organic EL display device according to the first embodiment of the disclosure, and is a view corresponding to FIG. 10.

FIGS. 1 to 11 illustrate a first embodiment of a display device according to the disclosure. Note that, in each of the following embodiments, an organic EL display device including an organic EL element layer is exemplified as a display device including a light-emitting element layer. Here, FIG. 1 is a plan view illustrating a schematic configuration of an organic EL display device 50*a* according to the present embodiment. Further, FIG. 2 is a plan view of a display region D of the organic EL display device 50*a*. FIG. 3 is a cross-sectional view of the organic EL display device 50*a* taken along a line III-III in FIG. 1. FIG. 4 is an equivalent circuit diagram of a thin film transistor layer 20 constituting the organic EL display device 50*a*. Further, FIG. 5 is a cross-sectional view of an organic EL layer 23 constituting the organic EL display device 50*a*. FIG. 6 is a cross-sectional view of a frame region F of the organic EL display device 50*a* taken along a line VI-VI in FIG. 1. FIG. 7 is a plan view of a bending portion B of the frame region F of the organic EL display device 50*a*. FIGS. 8, 9, and 10 are cross-sectional views of the bending portion B of the organic EL display device 50*a* taken along a line VIII-VIII, a line IX-IX, and a line X-X in FIG. 7, respectively. Further, FIG. 11 is a cross-sectional view of an organic EL display device 50*aa* of a modified example of the organic EL display device 50*a*, and is a view corresponding to FIG. 10.

As illustrated in FIG. 1, the organic EL display device 50*a* includes, for example, the display region D that is provided in a rectangular shape and in which an image is displayed, and the frame region F provided in a frame-like shape surrounding the display region D. Note that, in the present embodiment, the display region D having the rectangular shape is exemplified, but the rectangular shape includes a substantially rectangular shape such as a shape whose sides are arc-shaped, a shape whose corners are arc-shaped, and a shape in which a part of a side has a notch, for example.

As illustrated in FIG. 2, a plurality of subpixels P are arrayed in a matrix shape in the display region D. In addition, in the display region D, for example, a subpixel P including a red light-emitting region Lr for displaying a red color, a subpixel P including a green light-emitting region Lg for displaying a green color, and a subpixel P including a blue light-emitting region Lb for displaying a blue color are provided adjacent to one another, as illustrated in FIG. 2. Note that one pixel is configured by, for example, three adjacent subpixels P including the red light-emitting region Lr, the green light-emitting region Lg, and the blue light-emitting region Lb in the display region D.

A terminal portion T is provided in an end portion of the frame region F on the right side in FIG. 1, extending in one direction (vertical direction in the drawing). In addition, between the display region D and the terminal portion T, as illustrated in FIG. 1, that is, in the frame region F, the bending portion B bendable by, for example, 180 degrees (in a U-shape) with the vertical direction in the drawing as a bending axis is provided on the display region D side of the terminal portion T, extending in one direction (vertical direction in the drawing). Here, in the frame region F, in a flattening film 19*a* described below, a trench G having a substantially C shape in a plan view is provided passing through the flattening film 19*a*, as illustrated in FIGS. 1, 3, and 6. Note that, as illustrated in FIG. 1, the trench G is provided in a substantially C shape open on the terminal portion T side in a plan view.

As illustrated in FIGS. 3, 6, 8, 9, and 10, the organic EL display device 50*a* includes a resin substrate layer 10, the thin film transistor (hereinafter, also referred to as a TFT) layer 20 provided on the resin substrate 10, an organic EL element layer 30 provided as a light-emitting element layer on the TFT layer 20, and a sealing film 40 provided on the organic EL element layer 30.

The resin substrate 10 is made of, for example, a polyimide resin.

As illustrated in FIG. 3, the TFT layer 20 includes a base coat film 11 provided on the resin substrate 10 as an inorganic insulating film, a plurality of first TFTs 9*a*, a plurality of second TFTs 9*b*, and a plurality of capacitors 9*c* provided on the base coat film 11, and the flattening film 19*a* provided on each of the first TFTs 9*a*, each of the second TFTs 9*b*, and each of the capacitors 9*c*. Here, in the TFT layer 20, as illustrated in FIGS. 2 and 4, a plurality of gate lines 14*g* are provided extending parallel with each other in the horizontal direction in the drawings. In the TFT layer 20, as illustrated in FIGS. 2 and 4, a plurality of source lines 18*f* are provided as a wiring line layer, extending parallel with each other in the vertical direction in the drawings. Further, in the TFT layer 20, as illustrated in FIGS. 2 and 4, a plurality of power source lines 18*g* are provided as a wiring line layer, extending parallel with each other in the vertical direction in the drawings. Then, as illustrated in FIG. 2, each of the power source lines 18*g* is provided adjacent to one of the source lines 18*f*. Further, in the TFT layer 20, as illustrated in FIG. 4, each of the subpixels P includes the first TFT 9*a*, the second TFT 9*b*, and the capacitor 9*c*.

For example, the base coat film 11 and a gate insulating film 13, a first interlayer insulating film 15, and a second interlayer insulating film 17 described below are each composed of a single-layer film or a layered film of an inorganic insulating film of silicon nitride, silicon oxide, silicon oxynitride, or the like.

The first TFT 9*a* is electrically connected to the corresponding gate line 14*g* and source line 18*f* in each of the subpixels P, as illustrated in FIG. 4. Additionally, as illustrated in FIG. 3, the first TFT 9*a* includes a semiconductor layer 12*a*, the gate insulating film 13, a gate electrode 14*a*, the first interlayer insulating film 15, the second interlayer insulating film 17, and a source electrode 18*a* and a drain electrode 18*b*, which are sequentially provided on the base coat film 11. Here, as illustrated in FIG. 3, the semiconductor layer 12*a* is provided in an island shape on the base coat film 11 using a polysilicon film such as low-temperature polysilicon (LTPS), for example, and includes a channel region, a source region, and a drain region. In addition, as illustrated in FIG. 3, the gate insulating film 13 is provided as an inorganic insulating film, covering the semiconductor layer 12*a*. Additionally, as illustrated in FIG. 3, the gate electrode 14*a* is provided on the gate insulating film 13, overlapping the channel region of the semiconductor layer 12*a*. Additionally, as illustrated in FIG. 3, the first interlayer insulating film 15 and the second interlayer insulating film 17 are provided in this order as inorganic insulating films, covering the gate electrode 14*a*. Additionally, as illustrated in FIG. 3, the source electrode 18*a* and the drain electrode 18*b* are provided as wiring line layers, separated from each other on the second interlayer insulating film 17. Additionally, as illustrated in FIG. 3, the source electrode 18*a* and the drain electrode 18*b* are electrically connected to the source region and the drain region of the semiconductor layer 12*a*, respectively, via each contact hole formed in a layered film including the gate insulating film 13, the first interlayer insulating film 15, and the second interlayer insulating film 17.

The second TFT 9*b* is electrically connected to the corresponding first TFT 9*a* and power source line 18*g* in each of the subpixels P, as illustrated in FIG. 4. As illustrated in FIG. 3, the second TFT 9*b* includes a semiconductor layer 12*b*, the gate insulating film 13, a gate electrode 14*b*, the first interlayer insulating film 15, the second interlayer insulating film 17, and a source electrode 18*c* and a drain electrode 18*d*, which are provided in this order on the base coat film 11. Here, as illustrated in FIG. 3, the semiconductor layer 12*b* is provided in an island shape on the base coat film 11 using a polysilicon film such as LTPS, for example, and includes a channel region, a source region, and a drain region. Additionally, as illustrated in FIG. 3, the gate insulating film 13 is provided, covering the semiconductor layer 12*b*. Additionally, as illustrated in FIG. 3, the gate electrode 14*b* is provided on the gate insulating film 13, overlapping the channel region of the semiconductor layer 12*b*. Additionally, as illustrated in FIG. 3, the first interlayer insulating film 15 and the second interlayer insulating film 17 are sequentially provided, covering the gate electrode 14*b*. Additionally, as illustrated in FIG. 3, the source electrode 18*c* and the drain electrode 18*d* are provided as wiring line layers, separated from each other on the second interlayer insulating film 17. Additionally, as illustrated in FIG. 3, the source electrode 18*c* and the drain electrode 18*d* are electrically connected to the source region and the drain region of the semiconductor layer 12*b*, respectively, via each contact hole formed in a layered film including the gate insulating film 13, the first interlayer insulating film 15, and the second interlayer insulating film 17.

Note that, in the present embodiment, the first TFT 9*a* and the second TFT 9*b* are exemplified as being a top-gate type TFT, but the first TFT 9*a* and the second TFT 9*b* may be a bottom-gate type TFT.

The capacitor 9*c* is electrically connected to the corresponding first TFT 9*a* and power source line 18*g* in each of the subpixels P, as illustrated in FIG. 4. Here, as illustrated in FIG. 3, the capacitor 9*c* includes a lower conductive layer 14*c* made of the same material as that of the gate electrodes 14*a* and 14*b* and formed in the same layer as that of the gate electrodes 14*a* and 14*b*, the first interlayer insulating film 15 provided covering the lower conductive layer 14*c*, and an upper conductive layer 16 provided on the first interlayer insulating film 15 and overlapping the lower conductive layer 14*c*. Note that, as illustrated in FIG. 3, the upper conductive layer 16 is electrically connected to the power source line 18*g* via a contact hole formed in the second interlayer insulating film 17.

The flattening film 19*a* has a flat surface in the display region D and is made of, for example, an organic resin material such as a polyimide resin, or a polysiloxane-based spin on glass (SOG) material.

As illustrated in FIG. 3, the organic EL element layer 30 includes a plurality of organic EL elements 25 arrayed in a matrix shape in correspondence with the plurality of subpixels P as a plurality of light-emitting elements, and an edge cover 22*a* provided in a lattice pattern in common to all the subpixels P so as to cover a peripheral end portion of a first electrode 21*a*, described below, of each organic EL element 25.

As illustrated in FIG. 3, the organic EL element 25 includes, in each subpixel P, the first electrode 21*a* provided on the flattening film 19*a* of the TFT layer 20, the organic EL layer 23 provided on the first electrode 21*a*, and a second electrode 24 provided on the organic EL layer 23.

As illustrated in FIG. 3, the first electrode 21*a* is electrically connected to the drain electrode 18*d* of the second TFT 9*b* of each subpixel P via a contact hole formed in the flattening film 19*a*. The first electrode 21*a* has a function of injecting holes (positive holes) into the organic EL layer 23. The first electrode 21*a* is preferably made of a material having a large work function to improve the efficiency of hole injection into the organic EL layer 23. Examples of materials constituting the first electrode 21*a* include metal materials such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). Examples of the material constituting the first electrode 21*a* may include alloys such as astatine (At)/astatine oxide ($AtO_2$). Furthermore, examples of materials constituting the first electrode 21*a* include electrically conductive oxides such as tin oxide (SnO), zinc oxide (ZnO), indium tin oxide (ITO), and indium zinc oxide (IZO). The first electrode 21*a* may also be formed by layering a plurality of layers made of any of the materials described above. Note that examples of compound materials having a high work function include indium tin oxide (ITO) and indium zinc oxide (IZO).

As illustrated in FIG. 5, each organic EL layer 23 includes a hole injection layer 1, a hole transport layer 2, a light-emitting layer 3, an electron transport layer 4, and an electron injection layer 5, which are provided in that order on the first electrode 21*a*.

The hole injection layer 1 is also referred to as an anode buffer layer, and has a function of reducing an energy level difference between the first electrode 21*a* and the organic EL layer 23 to thereby improve the hole injection efficiency from the first electrode 21*a* into the organic EL layer 23. Here, examples of materials constituting the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole transport layer 2 has a function of improving the hole transport efficiency from the first electrode 21*a* to the organic EL layer 23. Here, examples of materials constituting the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light-emitting layer 3 is a region where positive holes and electrons are injected from the first electrode 21*a* and the second electrode 24, respectively, and the holes and the electrons recombine, when a voltage is applied via the first electrode 21*a* and the second electrode 24. Here, the light-emitting layer 3 is made of a material having high luminous efficiency. Moreover, examples of materials constituting the light-emitting layer 3 include metal oxinoid compounds (8-hydroxyquinoline metal complexes), naphthalene derivatives, anthracene derivatives, diphenylethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, and polysilane.

The electron transport layer 4 has a function of facilitating migration of electrons to the light-emitting layer 3 efficiently. Here, examples of materials constituting the electron transport layer 4 include oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, and metal oxinoid compounds, as organic compounds.

The electron injection layer 5 has a function of reducing an energy level difference between the second electrode 24 and the organic EL layer 23 to thereby improve the efficiency of electron injection into the organic EL layer 23 from the second electrode 24, and the electron injection layer 5 can lower the drive voltage of the organic EL element 25 by this function. Note that the electron injection layer 5 is also referred to as a cathode electrode buffer layer. Here, examples of materials constituting the electron injection layer 5 include inorganic alkaline compounds, such as lithium fluoride (LiF), magnesium fluoride ($MgF_2$), calcium fluoride ($CaF_2$), strontium fluoride ($SrF_2$), and barium fluoride ($BaF_2$), aluminum oxide ($Al_2O_3$), and strontium oxide (SrO).

As illustrated in FIG. 3, the second electrode 24 is provided covering each of the organic EL layers 23 and the edge cover 22*a*. In addition, the second electrode 24 has a function of injecting electrons into the organic EL layer 23. In addition, the second electrode 24 is preferably made of a material with a low work function to improve the efficiency of electron injection into the organic EL layer 23. Here, examples of materials constituting the second electrode 24 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). The second electrode 24 may also be made of an alloy such as magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), and lithium fluoride (LiF)/calcium (Ca)/aluminum (Al), for example. In addition, the second electrode 24 may be made of electrically conductive oxide such as tin oxide (SnO), zinc oxide (ZnO), indium tin oxide (ITO), indium zinc oxide (IZO), for example. In addition, the second electrode 24 may be formed by layering a plurality of layers made of any of the materials described above. Note that examples of materials having a low work function include magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), and lithium fluoride (LiF)/calcium (Ca)/aluminum (Al).

The edge cover 22*a* is made of, for example, an organic resin material such as a polyimide resin or an acrylic resin, or a polysiloxane-based SOG material. Here, as illustrated in FIG. 3, part of a surface of the edge cover 22*a* projects upward in the drawing and is a pixel photo spacer provided in an island shape.

As illustrated in FIGS. 3 and 6, the sealing film 40 includes a first inorganic sealing film 36 provided covering the second electrode 24, an organic sealing film 37 provided on the first inorganic sealing film 36, and a second inorganic sealing film 38 provided covering the organic sealing film 37, and has a function of protecting the organic EL layer 23 from moisture, oxygen, and the like. Here, the first inorganic sealing film 36 and the second inorganic sealing film 38 are made of an inorganic material such as, for example, silicon oxide ($SiO_2$), aluminum oxide ($Al_2O_3$), silicon nitride (SiNx (where x is a positive number)) such as trisilicon tetranitride ($Si_3N_4$), or silicon carbonitride (SiCN). The organic sealing film 37 is made of an organic material such as an acrylic resin, a polyurea resin, a parylene resin, a polyimide resin, or a polyamide resin, for example.

Additionally, as illustrated in FIG. 1, the organic EL display device 50*a* includes, in the frame region F, a first dam wall Wa provided in a frame-like shape surrounding the display region D and overlapping a peripheral end portion of the organic insulating film 37, and a second dam wall Wb provided in a frame-like shape surrounding the first dam wall Wa.

As illustrated in FIG. 6, the first dam wall Wa includes a lower resin layer 19*b* made of the same material as that of the flattening film 19*a* and formed in the same layer as that of the flattening film 19*a*, and an upper resin layer 22*c* provided on the lower resin layer 19*b* with a conductive layer 21*b* interposed therebetween, made of the same material as that of the edge cover 22*a*, and formed in the same layer as that of the edge cover 22*a*. Here, as illustrated in FIG. 6, the conductive layer 21*b* is provided in a substantially C shape overlapping the trench G, the first dam wall Wa, and the second dam wall Wb in the frame region F. Note that the conductive layer 21*b* is made of the same material as that of the first electrode 21*a* and formed in the same layer as that of the first electrode 21*a*.

As illustrated in FIG. 6, the second dam wall Wb includes a lower resin layer 19*c* made of the same material as that of the flattening film 19*a* and formed in the same layer as that of the flattening film 19*a*, and an upper resin layer 22*d* provided on the lower resin layer 19*c* with the conductive layer 21*b* interposed therebetween, made of the same material as that of the edge cover 22*a*, and formed in the same layer as that of the edge cover 22*a*.

As illustrated in FIGS. 3 and 6, the organic EL display device 50*a* includes a first frame wiring line 18*h* provided as a wiring line layer in a substantially C shape outside of the trench G, with the first frame wiring line 18*h* surrounding the display region D and overlapping the first dam wall Wa and the second dam wall Wb in the frame region F. Here, the first frame wiring line 18*h* is configured to receive a low power supply voltage (ELVSS) in the terminal portion T. Further, as illustrated in FIG. 6, the first frame wiring line 18*h* is electrically connected to the second electrode 24 via the conductive layer 21*b*.

As illustrated in FIG. 3, the organic EL display device 50*a* includes a second frame wiring line 18*i* provided as a wiring line layer in a substantially C shape inside of the trench G in the frame region F. Here, the second frame wiring line 18*i* is configured to receive a high-power supply voltage (ELVDD) in the terminal portion T. The second frame wiring line 18*i* is electrically connected, on the display region D side, to the plurality of power source lines 18*g* disposed in the display region D.

Furthermore, as illustrated in FIGS. 7, 8, and 9, the organic EL display device 50*a* includes, in the bending portion B, a resin filling film 8*a* that fills a slit S formed in the base coat film 11, the gate insulating film 13, the first interlayer insulating film 15, and the second interlayer insulating film 17; a plurality of lead wiring lines 18*j* provided on the resin filling film 8*a* and the second interlayer insulating film 17; and a resin covering layer 19*d* covering the plurality of lead wiring lines 18*j*.

As illustrated in FIGS. 7, 8, and 9, the slit S is provided in a groove shape that passes through the base coat film 11, the gate insulating film 13, the first interlayer insulating film 15, and the second interlayer insulating film 17 and runs along an extending direction of the bending portion B, exposing a surface of the resin substrate 10. Here, as illustrated in FIGS. 7, 8 and 9, the slit S includes a first slit Sa in the gate insulating film 13, the first interlayer insulating film 15, and the second interlayer insulating film 17, exposing a surface of the base coat film 11, and a second slit Sb provided in the base coat film 11, exposing the surface of the resin substrate 10. Note that, as illustrated in FIGS. 8 and 9, the second slit Sb is also provided in the surface layer of the resin substrate 10.

The resin filling film 8*a* is made of an organic resin material such as a polyimide resin, for example. As illustrated in FIGS. 8 and 9, a surface of the resin filling film 8*a* is gradually increasingly lower than a surface of the second interlayer insulating film 17 outside of the slit S, from both end portions toward a central portion of the slit S in a width direction. Here, as illustrated in FIGS. 8, 9, and 10, protrusions Ca and recesses Cb, each extending in a direction orthogonal to the extending direction of the bending portion B, are alternately disposed in the extending direction of the bending portion B on the surface of the resin filling film 8*a*.

The plurality of lead wiring lines 18*j* extend parallel with each other at intervals of about 5 μm, for example, in a direction orthogonal to the extending direction of the bending portion B. Here, of the plurality of lead wiring lines 18*j*, one of a pair of lead wiring lines 18*j* adjacent to each other is provided on the protrusion Ca as illustrated in FIGS. 7 and 8, and the other of the pair of lead wiring lines 18*j* adjacent to each other is provided in the recess Cb as illustrated in FIGS. 7 and 9. Note that, in the organic EL display device 50*a*, in the washing performed before formation of the wiring line layers such as the source line 18*f*, foreign matters (for example, inorganic insulating film or metal film) are likely to accumulate on surfaces of inclined portions of the resin filling film 8*a* which lowers toward the central portion of the slit S, and the metal film of the wiring line layers is likely to remain on the surfaces of the inclined portions. However, even if metal film remains in the recesses Cb at relatively low positions of the surface of the resin filling film 8*a*, the metal film is unlikely to remain on the protrusions Ca of the resin filling film 18*j* at relatively high positions, making it possible to suppress short-circuiting between the lead wiring lines 18*j* adjacent to each other. Further, as illustrated in FIGS. 8 and 9, both end portions of each of the lead wiring lines 18*j* are electrically connected to a first gate conductive layer 14*d* and a second gate conductive layer 14*e*, respectively, via respective contact holes formed in a layered film of the first interlayer insulating film 15 and the second interlayer insulating film 17. Note that the lead wiring lines 18*j* are made of the same material as that of the wiring line layers such as the source line 18*f* and formed in the same layer as that of the wiring line layers such as the source line 18*f*. Further, as illustrated in FIG. 7, the first gate conductive layer 14*d* is provided between the gate insulating film 13 and the first interlayer insulating film 15 and is electrically connected to signal wiring lines (the gate line 14*g*, the source line 18*f*, and the like) extending toward the display region D. Further, as illustrated in FIG. 7, the second gate conductive layer 14*e* is provided between the gate insulating film 13 and the first interlayer insulating film 15 and, for example, is electrically connected to a signal terminal of the terminal portion T.

Note that, in the present embodiment, the organic EL display device 50*a* provided with the lead wiring lines 18*j* on the protrusions Ca and in the recesses Cb of the surface of the resin filling film 8*a* is exemplified. However, the device may be the organic EL display device 50*aa* provided with at least one of the plurality of lead wiring lines 18*j* on a protrusion Ca of the protrusions Ca of the surface of the resin filling film 8*a*, as illustrated in FIG. 11. Here, in the organic EL display device 50*aa*, as illustrated in FIG. 11, the plurality of lead wiring lines 18*j* are provided only on the protrusions Ca of the resin filling film 8*a*. According to this organic EL display device 50*aa*, with the lead wiring lines 18*j* not provided in the recesses Cb at relatively low positions where the metal film of the wiring line layers is likely to remain and provided only on the protrusions Ca at relatively high positions where the metal film of the wiring line layers is unlikely to remain as described above, it is possible to further suppress short-circuiting between the lead wiring lines 18*j* adjacent to each other.

The resin covering layer 19*d* is made of the same material as that of the flattening film 19*a* and formed in the same layer as that of the flattening film 19*a*.

Further, as illustrated in FIGS. 3 and 6, the organic EL display device 50*a* includes a plurality of peripheral photo spacers 22*b* provided in island shapes, protruding upward in the drawings, on the flattening film 19*a* in the frame region F. Each peripheral photo spacer 22*b* is made of the same material as that of the edge cover 22*a* and formed in the same layer as that of the edge cover 22*a*.

In the organic EL display device 50*a* described above, in each of the subpixels P, a gate signal is input to the first TFT 9*a* via the gate line 14*g* to turn on the first TFT 9*a*, a data signal is written in the gate electrode 14*b* of the second TFT 9*b* and the capacitor 9*c* via the source line 18*f*, and a current from the power source line 18*g* corresponding to a gate voltage of the second TFT 9*b* is supplied to the organic EL layer 23, whereby the light-emitting layer 3 of the organic EL layer 23 emits light to display an image. Note that, in the organic EL display device 50*a*, even when the first TFT 9*a* is turned off, the gate voltage of the second TFT 9*b* is held by the capacitor 9*c*. Thus, the light emission by the light-emitting layer 3 is maintained until the gate signal of the next frame is input.

Next, a method of manufacturing the organic EL display device 50*a* according to the present embodiment will be described. Here, the method of manufacturing the organic EL display device 50*a* according to the present embodiment includes a TFT layer formation process, an organic EL element layer formation process, and a sealing film formation process.

TFT Layer Formation Process

First, for example, an inorganic insulating film (about 1000 nm in thickness) such as a silicon oxide film is formed on the resin substrate 10 formed on a glass substrate, for example, by plasma chemical vapor deposition (CVD), to form the base coat film 11.

Subsequently, for example, an amorphous silicon film (about 50 nm in thickness) is formed, by plasma CVD, on the substrate surface on which the base coat film 11 is formed, the amorphous silicon film is crystallized by laser annealing or the like to form a semiconductor film of a polysilicon film, and then the semiconductor film is patterned to form the semiconductor layers 12*a* and 12*b*.

Subsequently, an inorganic insulating film (about 100 nm in thickness) such as a silicon oxide film is formed on the substrate surface on which the semiconductor layers 12*a* and 12*b* are formed by, for example, plasma CVD, to form the gate insulating film 13.

Furthermore, an aluminum film (about 350 nm in thickness), a molybdenum nitride film (about 50 nm in thickness), and the like are sequentially formed on the substrate surface on which the gate insulating film 13 is formed by, for example, a sputtering method, and then a metal layered film thereof is patterned to form the gate line 14*g*, the gate electrodes 14*a* and 14*b*, the lower conductive layer 14*c*, the first gate conductive layer 14*d*, and the second gate conductive layer 14*e*.

Thereafter, the source region and the drain region are each formed on the semiconductor layer 12*a* (12*b*) by doping impurity ions using the gate electrodes 14*a* and 14*b* as a mask.

Subsequently, an inorganic insulating film (about 100 nm in thickness) such as a silicon oxide film is formed by, for example, plasma CVD, on the substrate surface on which the source region and the drain region are each formed on the semiconductor layer 12*a* (12*b*) to form the first interlayer insulating film 15.

Subsequently, an aluminum film (about 350 nm in thickness), a molybdenum nitride film (about 50 nm in thickness), and the like are sequentially formed on the substrate surface on which the first interlayer insulating film 15 is formed by, for example, a sputtering method, and then a metal layered film thereof is patterned to form the upper conductive layer 16*c*.

Furthermore, an inorganic insulating film (about 500 nm in thickness) such as a silicon oxide film is formed on the substrate surface on which the upper conductive layer 16*c* is formed by, for example, plasma CVD to form the second interlayer insulating film 17.

Subsequently, the second interlayer insulating film 17, the first interlayer insulating film 15, and the gate insulating film 13 are patterned to form the contact hole and the first slit Sa, and then the base coat film 11 is partially etched to form the second slit Sb, thereby forming the slit S.

Thereafter, a photosensitive polyimide resin is applied by, for example, a spin coating method or a slit coating method onto the substrate surface on which the slit S is formed, and then the coating film is pre-baked, exposed using a halftone mask and gray tone mask, developed, and post-baked to form, in a predetermined shape, the resin filling film 8*a* filling the slit S of the bending portion B.

Furthermore, the substrate surface on which the resin filling film 8*a* is formed is washed, a titanium film (about 30 nm in thickness), an aluminum film (about 300 nm in thickness), and a titanium film (about 50 nm in thickness) are sequentially formed by, for example, a sputtering method, on the substrate surface, and then a metal layered film thereof is patterned to form the wiring line layers such as the source electrodes 18*a* and 18*c*, the drain electrodes 18*b* and 18*d*, the source line 18*f*, the power source line 18*g*, the first frame wiring line 18*h*, the second frame wiring line 18*i*, and the lead wiring line 18*j*.

Finally, a photosensitive polyimide resin (about 2 μm in thickness) is applied, by, for example, a spin coating method or a slit coating method, onto the substrate surface on which the wiring line layers are formed, and then the coating film is pre-baked, exposed, developed, and post-baked to form the flattening film 19*a* and the like.

Thus, a TFT layer 20 can be formed as described above.

Organic EL Element Layer Formation Process

The organic EL element 25 is formed by forming the first electrode 21*a*, the edge cover 22*a*, the organic EL layer 23 (the hole injection layer 1, the hole transport layer 2, the light-emitting layer 3, the electron transport layer 4, and the electron injection layer 5), and the second electrode 24 on the flattening film 19*a* of the TFT layer 20 formed in the TFT layer formation process described above by using a known method, whereby the organic EL element layer 30 is formed.

Sealing Film Formation Process

First, an inorganic insulating film such as a silicon nitride film, a silicon oxide film, or a silicon oxynitride film, for example, is formed by plasma CVD using a mask, on the substrate surface on which the organic EL element layer 30 is formed in the organic EL element layer formation process described above, to form the first inorganic sealing film 36.

Subsequently, on the substrate surface on which the first inorganic sealing film 36 is formed, a film made of an organic resin material such as acrylic resin is formed, for example, by an ink-jet method, to form the organic sealing film 37.

Furthermore, an inorganic insulating film such as a silicon nitride film, a silicon oxide film, or a silicon oxynitride film, for example, is formed by plasma CVD on the substrate on which the organic sealing film 37 is formed by using a mask to form the second inorganic sealing film 38, thereby forming the sealing film 40.

Finally, after a protective sheet (not illustrated) is bonded on the substrate surface on which the sealing film 40 is formed, the glass substrate is peeled off from a lower surface of the resin substrate 10 by irradiation with laser light from the glass substrate side of the resin substrate 10, and then a protective sheet (not illustrated) is bonded on the lower surface of the resin substrate 10 from which the glass substrate was peeled.

Thus, the organic EL display device 50*a* of the present embodiment can be manufactured as described above.

As described above, according to the organic EL display device 50*a* of the present embodiment, the bending portion B of the frame region F is provided with the resin filling film 8*a* filling the slit S formed in the base coat film 11, the gate insulating film 13, the first interlayer insulating film 15, and the second interlayer insulating film 17. Then, on the resin filling film 8*a*, the plurality of lead wiring lines 18*j* are provided extending parallel with each other in a direction orthogonal to the extending direction of the bending portion B. Here, the resin filling film 8*a* is provided so that the surface thereof is increasingly lower than a surface of the first interlayer insulating film 17 outside of the slit S, from both end portions toward a central portion of the slit S in the width direction. Therefore, in the washing prior to formation of the wiring line layers such as the source line 18*f*, foreign matters are likely to accumulate on the surfaces of the inclined portions of the resin filling film 8*a* that are lower toward the central portion of the slit S, and the metal film of the wiring line layers is likely to remain on the surfaces of the inclined portions. However, the protrusions Ca and the recesses Cb, each extending in the direction orthogonal to the extending direction of the bending portion B, are alternately disposed in the extending direction of the bending portion B on the surface of the resin filling film 8*a*, making the metal film of the lead wiring lines 18*j* on the surface of the resin filling film 8*a*, even if residual in the recesses Cb relatively low in position, less likely to remain on the protrusions Ca relatively high in position. Then, of the plurality of lead wiring lines 18*j*, one of a pair of lead wiring lines 18*j* adjacent to each other is provided on the protrusion Ca, and the other of the pair of lead wiring lines 18*j* adjacent to each other is provided in the recess Cb, making it possible to suppress short-circuiting between the lead wiring line 18*j* provided on the protrusion Ca and the lead wiring line 18*j* provided in the recess Cb adjacent thereto. This makes it possible to suppress short-circuiting between the lead wiring lines 18*j* adjacent to each other, and thus suppress short-circuiting between wiring lines in the bending portion B of the frame region F.

Second Embodiment

Figure 12:
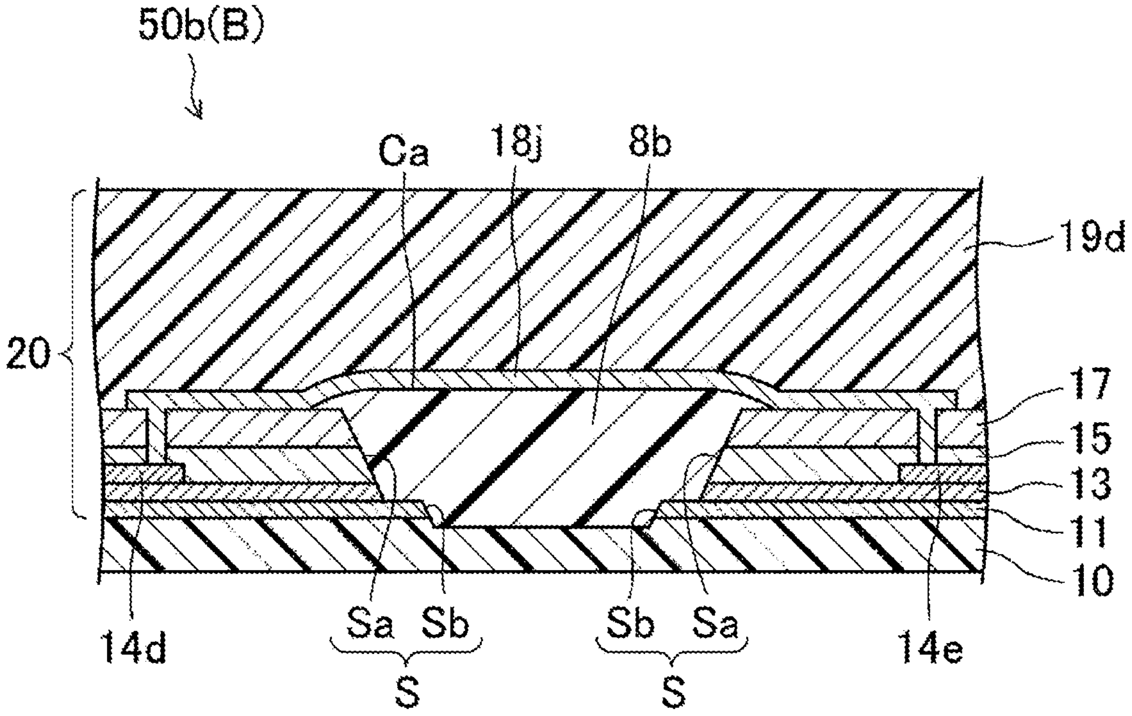
FIG. 12 is a cross-sectional view of a bending portion of the organic EL display device according to a second embodiment of the disclosure, and is a view corresponding to FIG. 8.
Figure 13:
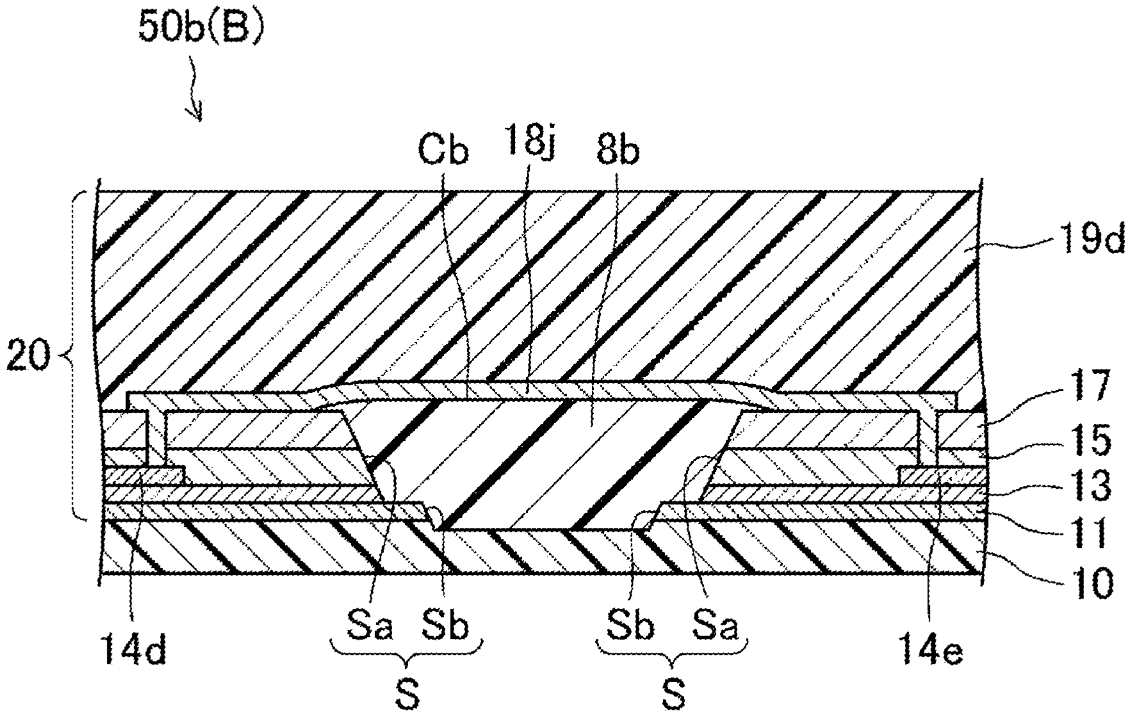
FIG. 13 is a cross-sectional view of the bending portion of the organic EL display device according to the second embodiment of the disclosure, and is a view corresponding to FIG. 9.
Figure 14:
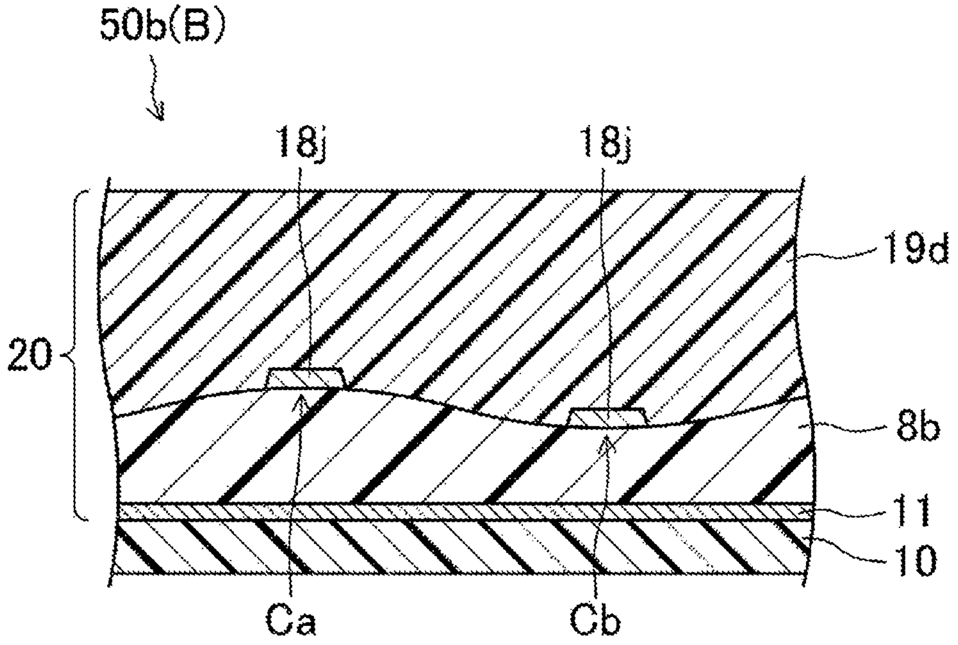
FIG. 14 is a cross-sectional view of the bending portion of the organic EL display device according to the second embodiment of the disclosure, and is a view corresponding to FIG. 10.

FIGS. 12 to 14 illustrate a second embodiment of a display device according to the disclosure. Here, FIGS. 12, 13, and 14 are cross-sectional views of the bending portion B of an organic EL display device 50*b* according to the present embodiment, and are views corresponding to FIGS. 8, 9, and 10 described in the first embodiment above. Note that, in the following embodiment, portions identical to those in FIGS. 1 to 11 are denoted by the same reference signs, and their detailed descriptions are omitted.

In the first embodiment described above, the organic EL display device 50*a* in which the surface of the resin filling film 8*a* at the central portion of the slit S in the width direction is lower than the surface of the second interlayer insulating film 17 is exemplified. However, in the present embodiment, the organic EL display device 50*b* in which the surface of the resin filling film 8*b* at the central portion of the slit S in the width direction is higher than the surface of the second interlayer insulating film 17 is exemplified.

As with the organic EL display device 50*a* of the first embodiment described above, the organic EL display device 50*b* includes the display region D provided in a rectangular shape and the frame region F provided in a frame-like shape surrounding the display region D.

Further, as with the organic EL display device 50*a* of the first embodiment described above, the organic EL display device 50*b* includes the resin substrate 10, the TFT layer 20 provided on the resin substrate 10, the organic EL element layer 30 provided on the TFT layer 20, and the sealing film 40 provided on the organic EL element layer 30.

Further, as with the organic EL display device 50*a* of the first embodiment described above, the organic EL display device 50*b* includes the first dam wall Wa and the second dam wall Wb in the frame region F.

In addition, as with the organic EL display device 50*a* of the first embodiment described above, the organic EL display device 50*b* includes the first frame wiring line 18*h* and the second frame wiring line 18*i* in the frame region F.

Further, as illustrated in FIGS. 12, 13, and 14, the organic EL display device 50*b* includes, in the bending portion B, a resin filling film 8*b* that fills the slit S formed in the base coat film 11, the gate insulating film 13, the first interlayer insulating film 15, and the second interlayer insulating film 17; the plurality of lead wiring lines 18*j* provided on the resin filling film 8*b* and the second interlayer insulating film 17; and the resin covering layer 19*d* provided covering the plurality of lead wiring lines 18*j*.

The resin filling film 8*b* is made of, for example, an organic resin material such as a polyimide resin. As illustrated in FIGS. 12 and 13, a surface of the resin filling film 8*b* is gradually increasingly higher than the surface of the second interlayer insulating film 17 outside of the slit S, from both end portions toward the central portion of the slit S in the width direction. Here, as illustrated in FIGS. 12, 13, and 14, the protrusions Ca and the recesses Cb, each extending in a direction orthogonal to the extending direction of the bending portion B, are alternately disposed in the extending direction of the bending portion B on the surface of the resin filling film 8*b*.

Of the plurality of lead wiring lines 18*j*, one of a pair of lead wiring lines 18*j* adjacent to each other is provided on the protrusion Ca as illustrated in FIGS. 12 and 14, and the other of the pair of lead wiring lines 18*j* adjacent to each other is provided in the recess Cb as illustrated in FIGS. 13 and 14. Note that, in the organic EL display device 50*b*, in the washing performed before formation of the wiring line layers such as the source line 18*f*, foreign matters are unlikely to accumulate on surfaces of inclined portions of the resin filling film 8*b*, which rises toward the central portion of the slit S, and thus the metal film of the wiring line layers is unlikely to remain on the inclined portions to begin with. However, even if metal film remains in the recesses Cb at relatively low positions on the surface of the resin filling film 8*b*, the metal film is even more unlikely to remain on the protrusions Ca of the resin filling film 18*j* at relatively high positions, making it possible to suppress short-circuiting between the lead wiring lines 18*j* adjacent to each other.

Note that, in the present embodiment, the organic EL display device 50*b* provided with the lead wiring lines 18*j* on the protrusions Ca and in the recesses Cb of the surface of the resin filling film 8*b* is exemplified. However, the lead wiring lines 18*j* may be provided only on the protrusions Ca of the surface of the resin filling film 8*b*.

Further, as with the organic EL display device 50*a* of the first embodiment described above, the organic EL display device 50*b* includes the plurality of peripheral photo spacers 22*b* provided on the flattening film 19*a* in island shapes in the frame region F.

As with the organic EL display device 50*a* of the first embodiment described above, the organic EL display device 50*b* described above is flexible and is configured to display an image by causing the light-emitting layer 3 of the organic EL layer 23 to emit light as appropriate, via the first TFT 9*a* and the second TFT 9*b* in each of the subpixels P.

The organic EL display device 50*b* of the present embodiment can be manufactured by modifying a surface shape of the resin filling film 8*a* in the manufacturing method of the organic EL display device 50*a* of the first embodiment described above.

As described above, according to the organic EL display device 50*b* of the present embodiment, the bending portion B of the frame region F is provided with the resin filling film 8*b* filling the slit S formed in the base coat film 11, the gate insulating film 13, the first interlayer insulating film 15, and the second interlayer insulating film 17. Then, on the resin filling film 8*b*, the plurality of lead wiring lines 18*j* are provided extending parallel with each other in a direction orthogonal to the extending direction of the bending portion B. Here, the resin filling film 8*b* is provided so that the surface thereof is increasingly higher than the surface of the first interlayer insulating film 17 outside of the slit S, from both end portions toward the central portion of the slit S in the width direction. Therefore, in the washing prior to formation of the wiring line layers such as the source line 18*f*, foreign matters are unlikely to accumulate on the surfaces of the inclined portions of the resin filling film 8*b* that are higher toward the central portion of the slit S, and the metal film of the wiring line layers is likely to remain on the surfaces of the inclined portions. Then, the protrusions Ca and the recesses Cb, each extending in the direction orthogonal to the extending direction of the bending portion B, are alternately disposed in the extending direction of the bending portion B on the surface of the resin filling film 8*b*, making the metal film of the lead wiring lines 18*j* on the surface of the resin filling film 8*b*, even if residual in the recesses Cb at relatively lower positions, even more unlikely to remain on the protrusions Ca relatively high in position. Then, of the plurality of lead wiring lines 18*j*, one of a pair of lead wiring lines 18*j* adjacent to each other is provided on the protrusion Ca and the other of the pair of lead wiring lines 18*j* adjacent to each other is provided in the recess Cb, making it possible to further suppress short-circuiting between the lead wiring line 18*j* provided on the protrusion Ca and the lead wiring line 18*j* provided in the recess Cb adjacent thereto. This makes it possible to further suppress short-circuiting between the lead wiring lines 18*j* adjacent to each other, and thus further suppress short-circuiting between wiring lines in the bending portion B of the frame region F.

Other Embodiments

In each of the embodiments described above, the organic EL layer having a five-layer structure including the hole injection layer, the hole transport layer, the light-emitting layer, the electron transport layer, and the electron injection layer is exemplified, but the organic EL layer may have a three-layer structure including a hole injection-cum-transport layer, a light-emitting layer, and an electron transport-cum-injection layer, for example.

In each of the embodiments described above, the organic EL display device including the first electrode as an anode and the second electrode as a cathode is exemplified. However, the disclosure is also applicable to an organic EL display device in which the layered structure of the organic EL layer is reversed with the first electrode being a cathode and the second electrode being an anode.

In each of the embodiments described above, the organic EL display device in which the electrode of the TFT connected to the first electrode serves as the drain electrode is exemplified. However, the disclosure is also applicable to an organic EL display device in which the electrode of the TFT connected to the first electrode is referred to as the source electrode.

In each of the embodiments described above, the organic EL display device is exemplified as a display device. However, the disclosure can also be applied to a display device including a plurality of light-emitting elements driven by a current, for example, to a display device including quantum dot light-emitting diodes (QLEDs), which are a light-emitting element using a quantum dot-containing layer.

INDUSTRIAL APPLICABILITY

As described above, the disclosure is useful for a flexible display device.

The invention claimed is:

1. A display device comprising:

a resin substrate;

a thin film transistor layer provided on the resin substrate and including an inorganic insulating film; and a light-emitting element layer provided on the thin film transistor layer and arrayed with a plurality of light-emitting elements corresponding to a plurality of subpixels that forms a display region, wherein:

a frame region is provided surrounding the display region, a terminal portion is provided at an end portion of the frame region, a bending portion is provided between the display region and the terminal portion, the bending portion extending in an extending direction, a slit is provided at the bending portion in the inorganic insulating film, the slit extending in the extending direction of the bending portion and exposing a surface of the resin substrate, a resin filling film is provided at the bending portion, the resin filling film filling the slit, wherein a surface of the resin filling film is increasingly lower than a surface of the inorganic insulating film outside of the slit, from both end portions toward a central portion of the slit in a width direction, a plurality of lead wiring lines is provided on the resin filling film, the plurality of lead wiring lines extending parallel with each other in a direction intersecting the extending direction of the bending portion, protrusions and recesses are alternately disposed in the extending direction of the bending portion on the surface of the resin filling film, each of the protrusions and recesses extending in a direction intersecting the extending direction of the bending portion, and at least one of the plurality of lead wiring lines is provided on a protrusion of the protrusions.

2. The display device according to claim 1, wherein, in the plurality of lead wiring lines, one of a pair of the lead wiring lines adjacent to each other is provided on the protrusion of the protrusions, and the other one of the pair of lead wiring lines is provided in a recess of the recesses.

3. The display device according to claim 1, wherein:

the thin film transistor layer includes, as the inorganic insulating film, a base coat film, a gate insulating film, and an interlayer insulating film that are sequentially layered on the resin substrate in this stated order, a first slit is provided in the gate insulating film and the interlayer insulating film as a first portion of the slit, the first slit exposing a surface of the base coat film, and a second slit is provided in the base coat film as a second portion of the slit, the second slit exposing the surface of the resin substrate.

4. The display device according to claim 3, wherein the second slit is also provided in a surface layer of the resin substrate.

5. The display device according to claim 3, wherein:

the thin film transistor layer includes;

a wiring line layer provided on the interlayer insulating film, and a flattening film provided on the wiring line layer, and each of the plurality of lead wiring lines is made of the same material as that of the wiring line layer and is provided in the same layer as that of the wiring line layer.

6. The display device according to claim 5, wherein each of the plurality of lead wiring lines is covered with a resin covering layer made of the same material as that of the flattening film and formed in the same layer as that of the flattening film.

7. The display device according to claim 1, further comprising:

a sealing film in which a first inorganic sealing film, an organic sealing film, and a second inorganic sealing film are sequentially layered, in this stated order, the sealing film covering the light-emitting element layer.

8. The display device according to claim 1, wherein each of the plurality of light-emitting elements is an organic electroluminescence element.

9. A display device comprising:

a resin substrate;

a thin film transistor layer provided on the resin substrate and including an inorganic insulating film, wherein the thin film transistor layer includes, as the inorganic insulating film, a base coat film, a gate insulating film, and an interlayer insulating film that are sequentially layered on the resin substrate in this stated order; and a light-emitting element layer provided on the thin film transistor layer and arrayed with a plurality of light-emitting elements corresponding to a plurality of subpixels that forms a display region, wherein:

a frame region is provided surrounding the display region, a terminal portion is provided at an end portion of the frame region, a bending portion is provided between the display region and the terminal portion, the bending portion extending in an extending direction, a slit is provided at the bending portion in the inorganic insulating film, the slit extending in the extending direction of the bending portion and exposing a surface of the resin substrate, wherein the slit includes a first slit provided in the gate insulating film and the interlayer insulating film as a first portion of the slit, the first slit exposing a surface of the base coat film, and a second slit provided in the base coat film as a second portion of the slit, the second slit exposing the surface of the resin substrate, a resin filling film is provided at the bending portion, the resin filling film filling the slit, a plurality of lead wiring lines is provided on the resin filling film, the plurality of lead wiring lines extending parallel with each other in a direction intersecting the extending direction of the bending portion, protrusions and recesses are alternately disposed in the extending direction of the bending portion on the surface of the resin filling film, each of the protrusions and recesses extending in a direction intersecting the extending direction of the bending portion, and at least one of the plurality of lead wiring lines is provided on a protrusion of the protrusions.

10. The display device according to claim 9, wherein, in the plurality of lead wiring lines, one of a pair of the lead wiring lines adjacent to each other is provided on the protrusion of the protrusions, and the other one of the pair of lead wiring lines is provided in a recess of the recesses.

11. The display device according to claim 9, wherein a surface of the resin filling film is increasingly higher than a surface of the inorganic insulating film outside of the slit, from both end portions toward a central portion of the slit in a width direction.

12. The display device according to claim 9, wherein the second slit is also provided in a surface layer of the resin substrate.

13. The display device according to claim 9, wherein:

the thin film transistor layer includes:

a wiring line layer provided on the interlayer insulating film, and a flattening film provided on the wiring line layer, and each of the plurality of lead wiring lines is made of the same material as that of the wiring line layer and is provided in the same layer as that of the wiring line layer.

14. The display device according to claim 13, wherein each of the plurality of lead wiring lines is covered with a resin covering layer made of the same material as that of the flattening film and formed in the same layer as that of the flattening film.

15. The display device according to claim 9, comprising a sealing film in which a first inorganic sealing film, an organic sealing film, and a second inorganic sealing film are sequentially layered, in this stated order, the sealing film covering the light-emitting element layer.

16. The display device according to claim 9, wherein each of the plurality of light-emitting elements is an organic electroluminescence element.

* * * * *